(12) United States Patent
Singh et al.

(10) Patent No.: US 7,002,829 B2
(45) Date of Patent: Feb. 21, 2006

(54) APPARATUS AND METHOD FOR PROGRAMMING A ONE-TIME PROGRAMMABLE MEMORY DEVICE

(75) Inventors: Ranbir Singh, Orlando, FL (US); Richard J. McPartland, Nazareth, PA (US); Ross A. Kohler, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/675,571

(22) Filed: Sep. 30, 2003

(65) Prior Publication Data

US 2005/0070052 A1 Mar. 31, 2005

(51) Int. Cl.
*G11C 17/00* (2006.01)

(52) U.S. Cl. .................. 365/96; 365/94; 365/225.7; 257/107; 257/133; 257/115; 257/119

(58) Field of Classification Search ............... 365/94, 365/96 O, 225.7; 257/107, 133, 115, 119
See application file for complete search history.

(56) References Cited

U.S. PATENT DOCUMENTS

| 6,330,204 B1 * | 12/2001 | Miyagi | 365/225.7 |
| 6,472,686 B1 * | 10/2002 | Shah | 257/77 |
| 6,646,912 B1 * | 11/2003 | Hurst et al. | 365/175 |

* cited by examiner

*Primary Examiner*—VanThu Nguyen
(74) *Attorney, Agent, or Firm*—John L. DeAngelis, Jr.; Beusse Brownlee Wolter Mora & Maire, P.A.

(57) ABSTRACT

A method and apparatus for opening a fuse formed on a semiconductor substrate. The apparatus comprises a thyristor formed from CMOS device regions and having a one or two control terminals for permitting current to flow through the thyristor into the fuse, for opening the fuse.

32 Claims, 4 Drawing Sheets

APPARATUS AND METHOD FOR PROGRAMMING A ONE-TIME PROGRAMMABLE MEMORY DEVICE

FIELD OF THE INVENTION

The invention relates generally to integrated circuit memory devices and specifically to a method and apparatus for programming one-time programmable non-volatile memory devices.

BACKGROUND OF THE INVENTION

Memory devices for storing digital data are abundant in today's computers, automobiles, cell telephones and media information cards. Certain of these memory devices or storage elements, referred to as non-volatile memory, retain the stored digital data when power is removed from the device. For example non-volatile memory instructions instruct a computer during the boot-up process and store instructions and data for sending and receiving calls in a cellular telephone. Electronic products of all types, from microwave ovens to heavy industrial machinery, store their operating instructions in these non-volatile storage elements. Certain non-volatile memory devices offer multiple programming capabilities, with previously stored information overwritten by new data. Other non-volatile devices provide only one-time programmability.

Another class of memory devices, volatile memory devices, looses the stored information when power is removed. Dynamic random access memories (DRAM) and static random access memories (SRAM) are two types of volatile storage elements.

A read-only memory (ROM) is one type of permanent data storage non-volatile memory. Once stored in the ROM device, the data cannot be overwritten or otherwise altered. The ROM is "programmed" during its manufacture by making permanent electrical connections in selected memory cells. Since the ROM is programmed during the design stage, the stored information can be changed only by redesigning the ROM integrated circuit.

A programmable read-only memory (PROM) is a non-volatile device that is programmable after fabrication, but is programmable only once. In one type of PROM, each memory cell comprises a fusible link. The PROM is "programmed" by opening or blowing a fusible link in selected cells, while other links remain intact. A PROM can be programmed during or after fabrication by the manufacturer, or later by a purchaser. Advantageously, manufacturers can offer a single PROM hardware design that is user-programmable. Typically, the PROM includes one or more external pins for receiving current from an external source to open the fusible links.

An erasable programmable read-only memory (EPROM) is another non-volatile memory device, but an EPROM can be erased and reprogrammed as desired. The EPROM is programmed electronically and erased using ultraviolet light passing through an ultraviolet-permeable quartz window formed in the package. An EEPROM (electronically erasable programmable read-only memory) is yet another type of read-only memory that can be programmed, electronically erased and electronically reprogrammed.

A flash EEPROM memory is a type of EEPROM non-volatile memory that is especially prevalent in electronic devices where the user desires to add or change information after the memory device has been fabricated and inserted into the electronic device. For example, flash memory allows the user to add addresses and calendar entries in a personal digital assistant and erase and re-use media cards that store pictures taken with a digital camera. Flash memory devices differ form other EEPROM devices in that a flash memory permits entire banks or a large number of stored data words to be simultaneously erased, whereas other EEPROM devices permit the simultaneous erasure of only single words. Thus erasing a large memory block in a non-flash EEPROM is a much slower process than the same operation in a flash memory. Also, a flash EEPROM is typically smaller than other types of EEPROM memory devices.

An anti-fuse (comprising gallium oxide or amorphous silicon, for example) is another PROM non-volatile memory device. The anti-fuse is formed in an open state and can be programmed to a closed state using a voltage that is higher than the normal operating supply voltage for integrated circuits. Therefore, transistors in the programming circuitry of the anti-fuse device must be fabricated with higher junction break down voltages than the conventional transistor. Further, as newer integrated circuit process technologies employ reduced gate oxide thicknesses the fabricated devices require higher well doping levels, which results in even lower junction break down voltages. Thus the anti-fuse devices are becoming less compatible with advancing process technologies. Also, certain of the anti-fuse materials are not compatible with standard CMOS fabrication processes.

Certain non-volatile memory devices are referred to as "one-time programmable (OTP)," memories, including anti-fuse devices, EPROM's and PROM's. OTP memory can be further subdivided into those with relatively large arrays of storage elements (cells) and those with a relatively small number of cells. OTP devices with few cells are useful for trimming analog circuit device parameters (e.g., fuses are placed to short out or insert resistors within a serial string of resistors, thereby adjusting the total string resistance) and for permanently storing a relatively small number of non-modifiable data bits, such as for providing external identification of an integrated circuit chip by reading stored identification bits with an off-chip reader.

Another type of OTP non-volatile memory comprises conductive fuse storage elements disposed in an interconnect layer of an integrated circuit. Depending upon the process technology selected, a material of the conductive layer comprises polysilicon, metal or a silicide. Certain of these OTP devices comprise fuses formed on an upper layer interconnect structure. Other devices comprise buried fuses formed in lower level interconnect structures. Whether formed in the upper or lower level interconnect structures, the fuse is formed coincident with the formation of the interconnect structure by adding fuse features to the interconnect structure mask.

One technique uses a laser for programming (i.e., blowing) conductive fuse storage elements on the top layer of the interconnect structure. The integrated circuit is masked to expose the fuses to be opened, and laser energy is directed at selected exposed fuses to open them.

FIG. 1 illustrates another prior art circuit for blowing one or both fuses 10 and 12. The fuse 10 is connected between a source/drain 15 of a MOSFET 16 and ground. The fuse 12 is connected between a source/drain 17 of a MOSFET 18 and ground. A second source/drain 19 and 20 of the MOSFETs 16 and 18, respectively, are connected to a voltage or current source. To blow the fuse 10, a voltage Vg1 is applied to a gate 21 of the MOSFET 16, turning on the MOSFET 16 and permitting large current flow from the voltage or current source through the source/drain 19, the MOSFET channel and the source/drain 15 through the fuse 10, opening the fuse material. The fuse 12 is blown in a similar manner, through the MOSFET 18 by the application of a turn-on voltage to a gate 22 of the MOSFET 18. The current required to blow the fuses 10 and/or 12, typically about 10 to 50 mA, requires the use of relatively large MOSFET's. These transistors consume an area on the order of 1,000 microns$^2$ with a gate width of about 500 microns. Because of their large size, the MOSFETS 16 and 18 are more expensive to fabricate than smaller MOSFETs fabricated in most of today's integrated circuit devices and also consume valuable area on the integrated circuit.

BRIEF SUMMARY OF THE INVENTION

An apparatus for opening an integrated circuit fuse is taught. The apparatus is a bulk semiconductor device responsive to a current and controllable to both off and on states. In response to the on state, current flows through the bulk semiconductor device and the fuse, opening the fuse. In response to the off state, current flow is inhibited through the bulk semiconductor device and the fuse, thereby causing the fuse not to open.

A method for opening an integrated circuit fuse by controllably passing current through a bulk semiconductor device connected in series with the fuse is also taught. The bulk semiconductor device comprises a plurality of semiconductor pn junctions. Forward biasing the plurality of semiconductor pn junctions allows current flow through the bulk semiconductor device to the fuse for opening the fuse. Reverse biasing at least one of the plurality of semiconductor pn junctions prevents current flow through the bulk semiconductor device thus retaining the fuse in a closed state.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

FIG. 2A is a schematic representation of a three terminal thyristor and FIG. 2B is a cross-sectional view of a thyristor formed in an integrated circuit.

DETAILED DESCRIPTION OF THE INVENTION

Before describing in detail the particular method and apparatus for programing one-time programmable fuses according to the present invention, it should be observed that the present invention resides primarily in a novel and non-obvious combination of elements and process steps. Accordingly, the inventive features have been represented by conventional elements and process steps in the figures, showing only those specific details that are pertinent to the present invention so as not to obscure the disclosure with details that will be readily apparent to those skilled in the art having the benefit of the description herein.

A thyristor (also referred to as a silicon-controlled rectifier, SCR) is a four-layer pnpn device having three or four terminals, an anode, a cathode, and one or two gates. A three terminal thyristor 23 is illustrated schematically in FIG. 2A. When an anode 24 (connected to an anode terminal 24A) is held positive with respect to a cathode 25 (having a cathode terminal 25A), a relatively short duration and relatively low magnitude trigger current pulse applied to a gate 26 (via a gate terminal 26A) causes the thyristor to turn on to conduct current between the anode 24 and cathode 25. In this conducting state, the thyristor behaves as a rectifier. Conduction continues even after the trigger current on the gate terminal 26A is reduced to zero. The thyristor turns off only when the current flowing between the anode 24 and the cathode 25 falls below a holding current value. Since current is carried through the material bulk rather than through a surface region as in a MOSFET, thyristors generally have higher current ratings than MOSFETs.

Figure 1:
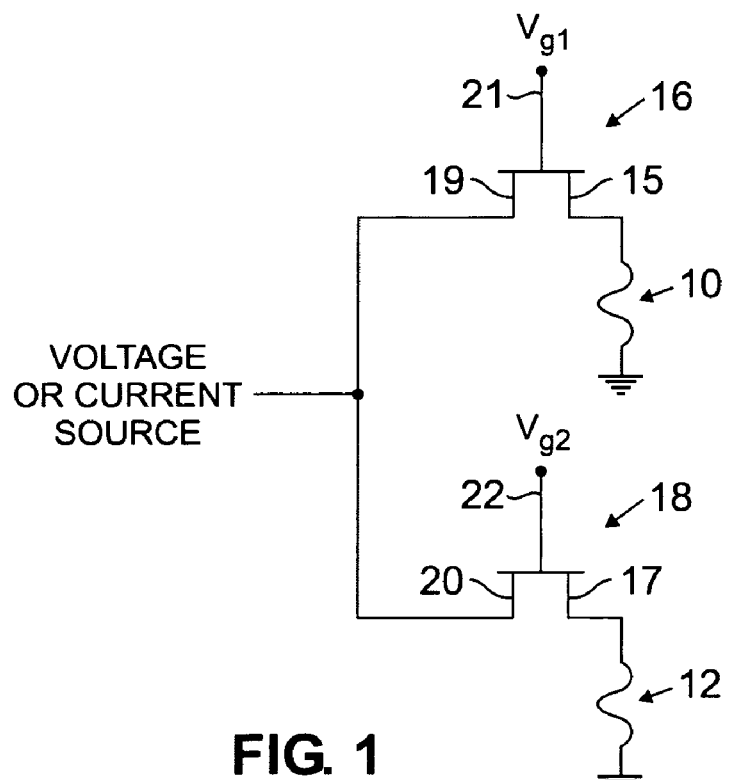
FIG. 1 is a prior art circuit for blowing one-time programmable fuses.
Figure 3:
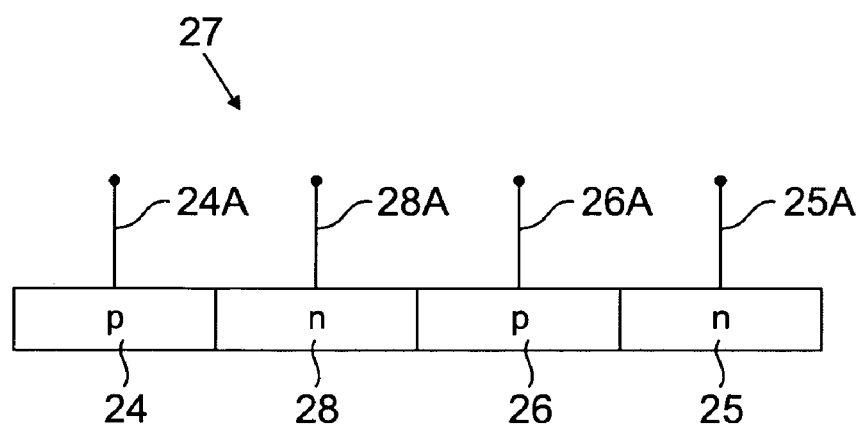
FIG. 3 is a schematic representation of a four terminal thyristor.

A four terminal thyristor 27, comprising a second gate 28 (and a gate terminal 28A) is illustrated in FIG. 3. Triggering the thyristor 27 into the on state can be assisted by pulsing the gate terminal 28A with a current of opposite polarity to the current pulse applied to the gate 26. Thyristor operation using one or two gates is well known in the art.

Figure 4:
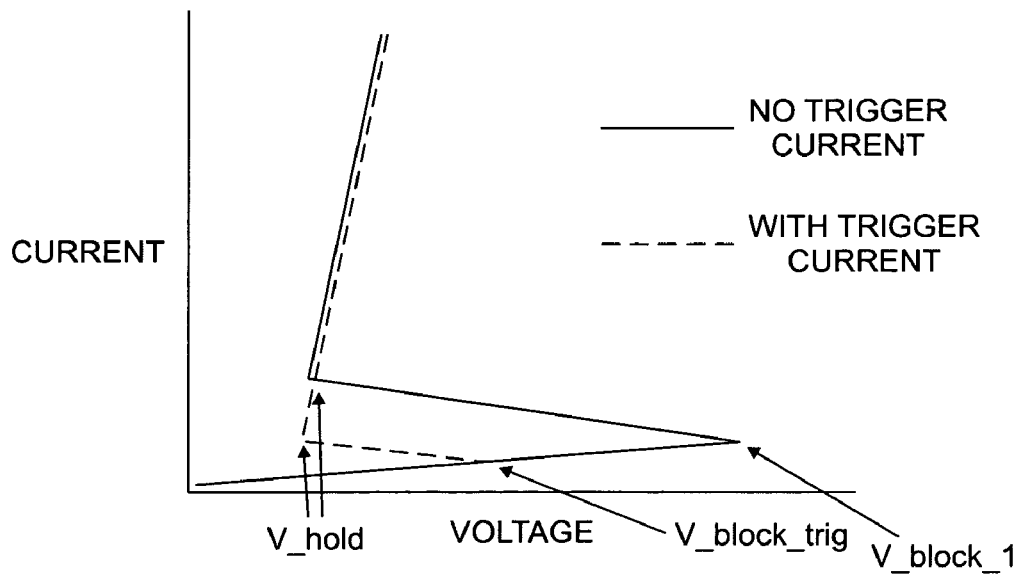
FIG. 4 is a graph illustrating the voltage/current characteristics of a conventional thyristor.

A typical voltage/current thyristor characteristic curve is illustrated in FIG. 4. The device current is plotted on the vertical axis and the anode-cathode voltage on the horizontal axis. When a voltage is applied across the thyristor, pn junctions 30 and 31 are forward biased and the np junction 32 is reversed biased. See FIG. 2A. The reverse biased junction 32 holds the voltage across the thyristor 23, maintaining the thyristor 23 in a high-resistance state with little conducting current. This condition is illustrated in FIG. 4 by a line from the origin to a point labeled V_block_1. As the device voltage is increased, the thyristor 23 remains in the high resistance state until the voltage reaches V_block_1, at which point the np junction 32 breaks down and the device goes into avalanche conduction. As shown in FIG. 4, the thyristor voltage drops to a value V_hold in avalanche conduction. Once at this operating point, the thyristor current increases with very little change in the voltage. Thus, the thyristor 23 latches into a low resistance state, which is maintained as long as the thyristor terminal voltage remains greater than V_hold. If the voltage drops below V_hold the thyristor switches back to an off state.

Injecting charge into the np junction 32 of the thyristor 23 reduces the blocking voltage from V_block_1 to V_block-_trigger, as shown by the FIG. 4 characteristic curve. Thus the injected charge triggers the thyristor into conduction at a lower voltage. As applied to the teachings of the present invention, the ability to select a triggering voltage allows triggering selected thyristors into a low resistance state, to pass current through only the fuses that need to be blown to program an OTP device. A four terminal thyristor, such as the thyristor 27, can also be used according to the teachings of the present invention to blow a fuse of an OTP device.

Figure 2B:
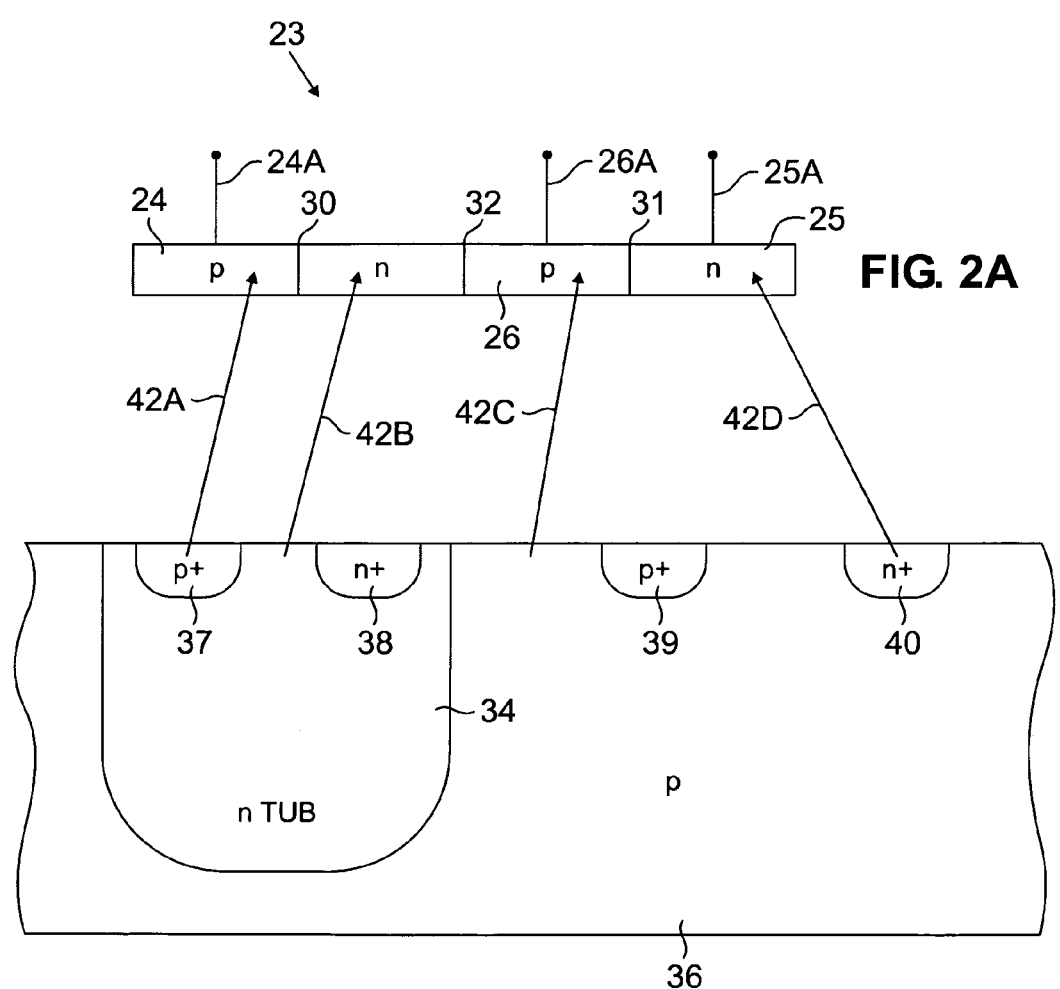

A conventional CMOS structure is illustrated in FIG. 2B, including an n tub 34 and a p region or substrate 36. A p+ region 37 and an n+ region 38 are formed within the n tub 34. A p+ region 39 and an n+ region 40 are formed within the p region or substrate 36. The mapping of the FIG. 2B doped regions to the thyristor device layers of FIG. 2A is indicated by arrowheads 42A–42D. Thus a thyristor is formed during the fabrication of a conventional CMOS device. According to the teachings of the present invention, a CMOS device is fabricated for each fuse in an OTP device. Application of a gate trigger current to a gate terminal of the selected thyristors programs the OTP by opening the appropriate fuses.

Figure 5:
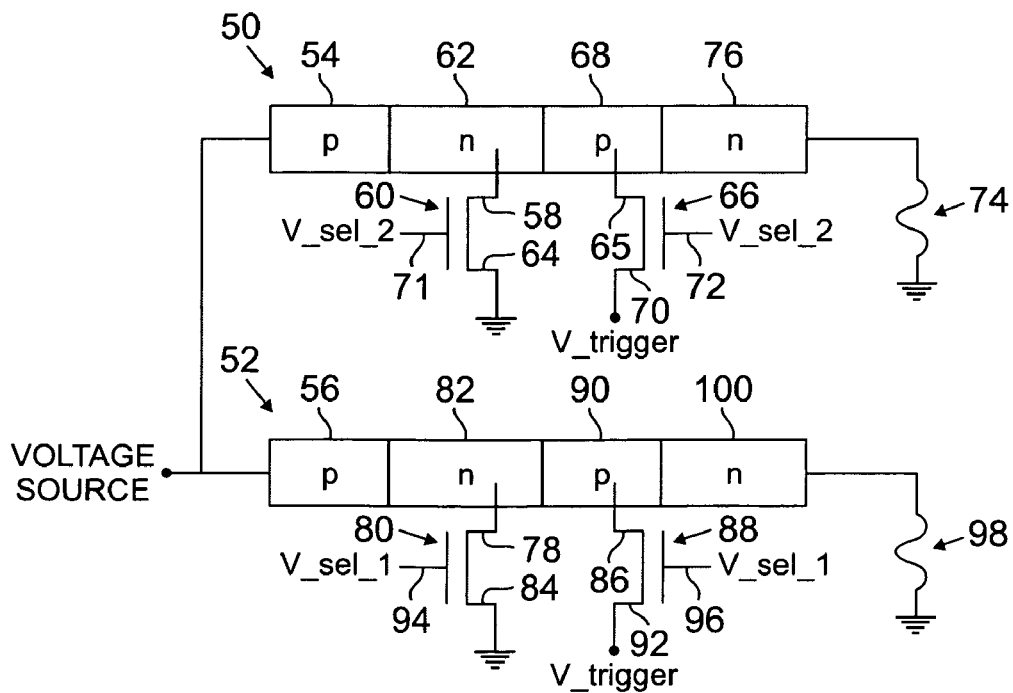
FIG. 5 is a schematic diagram illustrating a thyristor for programming an OTP device fuse according to the teachings of the present invention.

FIG. 5 illustrates two thyristors 50 and 52, each having four regions doped p-type or n-type as illustrated. A p-type region 54 of the thyristor 50 and a p-type region 56 of the thyristor 52 are connected to a voltage source. In another embodiment a current source replaces the voltage source. A source/drain terminal 58 of a MOSFET 60 (wherein the MOSFET 60 operates as a gating device) is connected to an n-type region 62 of the thyristor 50 (i.e., a first thyristor gate terminal). A source/drain terminal 64 of the MOSFET 60 is connected to ground.

A source/drain terminal 65 of a MOSFET 66 (wherein the MOSFET 66 operates as a gating device) is connected to a p-type region 68 of the thyristor 50 (i.e., a second thyristor gate terminal). A source/drain terminal 70 of the MOSFET 66 is responsive to a trigger voltage, V_trigger.

Gate terminals 71 and 72 of the MOSFETs 60 and 66, respectively, are responsive to a select voltage designated V_sel_2. A fuse 74 is connected to an n-type region 76 of the thyristor 50. Thus the source-channel-drain circuit of the MOSFET 60 connects the n-type region 62 to ground in response to the voltage on the gate terminal 71. Similarly, the source-channel-drain circuit of the MOSFET 66 connects the p-type region 68 to V_trigger in response to the voltage on the gate terminal 72.

A source/drain terminal 78 of a MOSFET 80 is connected to an n-type region 82 of the thyristor 52 (i.e., a first thyristor gate terminal). A source/drain terminal 84 of the MOSFET 80 is connected to ground. A source/drain terminal 86 of a MOSFET 88 is connected to a p-type region 90 of the thyristor 52 (i.e., a second thyristor gate terminal). A source/drain terminal 92 of the MOSFET 88 is responsive to a trigger voltage, V_trigger.

Gate terminals 94 and 96 of the MOSFETs 80 and 88, respectively, are responsive to a select voltage designated V_sel_1. A fuse 98 is connected between ground and an n-type region 100 of the thyristor 52. Thus the source-channel-drain circuit of the MOSFET 80 connects the n-type region 82 to ground in response to the voltage on the gate terminal 94. Similarly, the source-channel-drain circuit of the MOSFET 88 connects the p-type region 90 to V_trigger in response to the voltage on the gate terminal 96.

The fuses 74 and/or 98 are blown according to the teachings of the present invention by selectively triggering one of the thyristors 50 or 52 into a low resistance state (by operation of the gating devices, i.e., the MOSFET's 60, 66, 80 and 88) to pass current from the voltage source through the fuse to be blown or opened.

In one embodiment according to the present invention, the voltage of the voltage source is greater than V_hold but less than the V_block_1 for the thyristor 50. A forward bias is applied to the np junction 82/90 by applying a voltage V_sel_1 (in one embodiment V_sel_1 is about 3.3 volts) to the gate terminals 94 and 96 of the MOSFETs 80 and 88. The MOSFETs 80 and 88 turn on and the pn junction 82/90 is forward biased by the V_trigger voltage. The thyristor 52 is now in a low resistance state and current flows from the voltage source through the thyristor 52 and the fuse 98, blowing the fuse 98. If no gate voltage is applied to the MOSFETs 60 and 66 during this time, the thyristor 50 remains in a high resistance state and the fuse 74 remains in a closed state.

Both fuses 74 and 98 can be opened by driving both thyristors 50 and 52 into conduction by the application of the voltages V_sel_1 or V_sel_2 to all the MOSFETs 60, 66, 80 and 88, as illustrated. To open the fuse 74 and retain the fuse 98 in a closed state, the voltage V_sel_2 is applied to the gates 71 and 72 of the MOSFETs 60 and 66, respectively, while the MOSFETs 80 and 88 remain in an off state. To open the fuse 98 and retain the fuse 74 in a closed state, the voltage V_sel_2 is applied to the gates 94 and 96 of the MOSFETs 80 and 88, respectively, while the MOSFETs 60 and 66 remain in an off state.

In the embodiment of FIG. 5, all four MOSFETs 60, 66, 80 and 88 are N-channel MOSFETs, being activated by positive gate (active high) signals V_select_2 or V_select_1. In another embodiment not illustrated, the MOSFETS 66 and 88 are P-channel MOSFETs activated by signals that are complimentary (active low) to gate signals V_select_2 or V_select_1. In yet another embodiment not shown, the MOSFETS 60 and 80 are P-channel MOSFETs activated by signals that are complimentary (active low) to gate signals V_select_2 or V_select_1. In yet another embodiment not illustrated, the MOSFETS 60, 66, 80 and 88 are P-channel MOSFETs being activated by signals that are complimentary (active low) to gate signals V_select_2 or V_select_1.

In the embodiment of FIG. 5 thyristors 50 and 52 are controlled by gating the MOSFETs 60 and 66, or 80 and 88, respectively, to an on state. Since the MOSFET's 60 and 66 are connected to the first and the second thyristor gate terminals of the thyristor 50, gating the MOSFET's 60 and 66 applies a voltage across the pn junction 68/62, turning on the thyristor 50. In another embodiment the thyristor 50 comprises a three terminal device controlled by the MOSFET 66 alone. Similarly, if the thyristor 52 is a three terminal device, the MOSFET 88 alone can control the conduction state of the thyristor 52. In this embodiment the MOSFETS 60 and 80 are not be present.

In another embodiment, to open selected fuses 74 and/or 98, the voltage source in FIG. 5 is maintained at zero volts and in lieu of the trigger voltage V_trigger, a voltage pulse of sufficient magnitude to forward bias the np junction 62/68 of the thyristor 50 is applied to the pn junction 62/68 by gating the MOSFETs 60 and 66 to an on state. The voltage pulse causes the injection of minority carriers into the pn junction 62/68, and when the pulse ends sufficient minority carriers will have been injected into the thyristor 50 to maintain the thyristor 50 in a conducting state for a duration determined by the minority carrier lifetime (in the order of milliseconds). While in a conducting state, a voltage greater than V_hold and V_block_trig, but less than V_block_1, is applied to the thyristor 50 from the voltage source. In response, the thyristor 50 readily switches to the low resistance state and the fuse 74 is blown by current flowing through the thyristor 50 from the voltage source.

Advantageously, the area required to implement the thyristor 50 or 52 according to the present invention would be as small as 50 square microns, achieving a substantial area reduction in the fuse programming circuitry when compared to the prior art. Although the invention has been illustrated using a pnpn thyristor, an npnp thyristor can be employed in lieu thereof.

Figure 6:
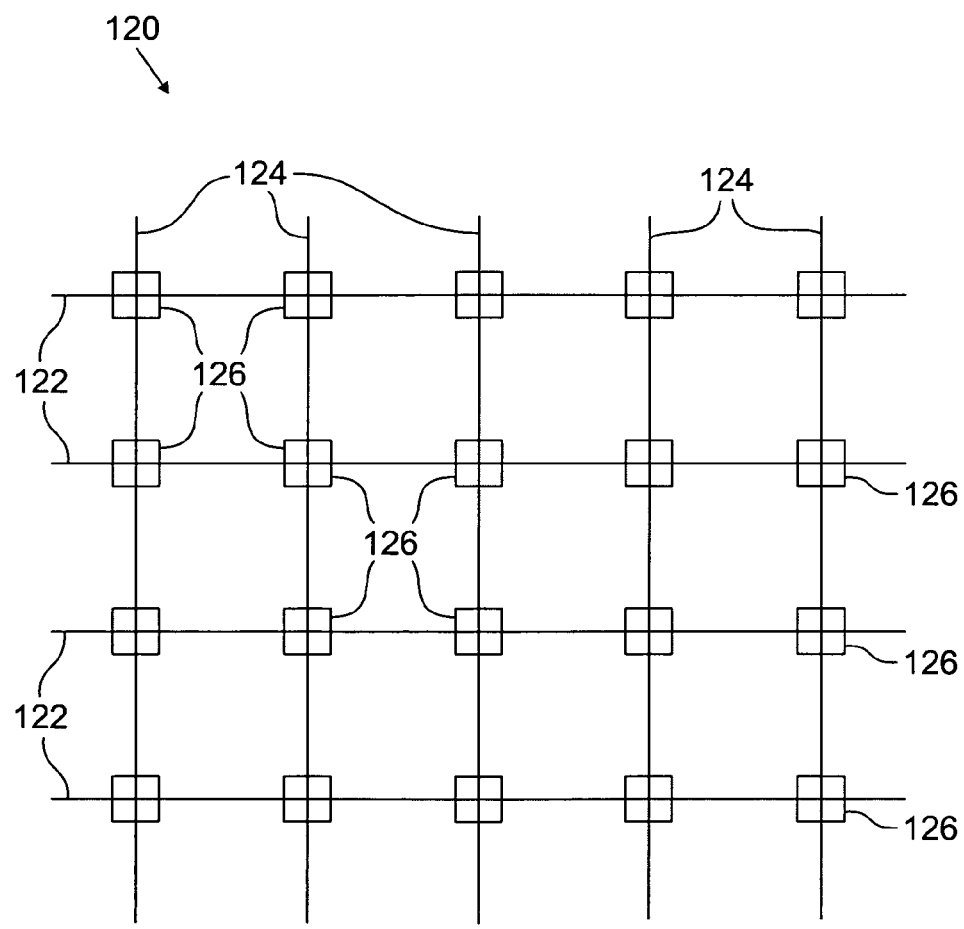
FIG. 6 is a schematic diagram of a memory array constructed according to the teachings of the present invention.

In one embodiment of the present invention, a memory array 120 of FIG. 6 comprises a plurality of addressable rows 122 and a plurality of addressable columns 124. A memory cell 126 is disposed at an intersection of each one of the plurality of rows 122 and columns 124. Each memory cell 126 further comprises a thyristor such as the thyristor 50 (or another bulk semiconductor device) of FIG. 5, the MOSFET's 60 and 66 operative therewith and a fuse such as the fuse 74 of FIG. 5. Each of the memory cells 126 is programmable by opening the fuse 74 according to the teachings of the present invention. Alternatively, the fuse 74 is retained in a closed state. Thus the memory array 120 can be programmed to store data by opening fuses associated with certain memory cells 126 while retaining other memory cells 126 in the closed state.

A process and apparatus have been described as useful for blowing or opening fuses in integrated circuits. While specific applications and examples of the invention have been illustrated and discussed, the principles disclosed herein provide a basis for practicing the invention in a variety of ways and in a variety of structures. Numerous variations are possible within the scope of the invention. The invention is limited only by the claims that follow.

What is claimed is:

1. An apparatus for opening an integrated circuit fuse by controllably passing current therethrough, comprising:
   a controllable bulk semiconductor device comprising a plurality of alternating p-type and n-type doped regions and coupled for selective current injection into the fuse;
   an element for switching on the bulk semiconductor device by applying an external voltage across two adjacent doped regions of the plurality of doped regions to forward bias a pn junction formed by the two adjacent doped regions; and
   wherein the current is injected into the fuse in response to an on state of the bulk semiconductor device for opening the fuse.

2. The apparatus of claim 1 wherein the bulk semiconductor device comprises a thyristor.

3. The apparatus of claim 2 wherein the thyristor comprises four doped regions of alternating dopant types forming three semiconductor junctions.

4. The apparatus of claim 3 further comprising a bias voltage, wherein the four doped regions comprise a first and a second semiconductor junction each forward biased by the bias voltage, and a third semiconductor junction intermediate the first and the second junctions, wherein the third semiconductor junction is forward biased whenever the semiconductor device is in the on state and reverse biased whenever the semiconductor device is in an off state.

5. The apparatus of claim 4 wherein the element for switching on the bulk semiconductor device forward biases the third semiconductor junction.

6. The apparatus of claim 1 wherein the bulk semiconductor device comprises a first, a second and a third doped region formed in a semiconductor substrate, and wherein the semiconductor substrate comprises a fourth doped region of the bulk semiconductor device.

7. The apparatus of claim 6 wherein the first doped region comprises a doped region of a first dopant type formed in a well of a second dopant type, and wherein the second region comprises the well of the second dopant type, and wherein the fourth region comprises a substrate region of a first dopant type, and wherein the third region comprises a doped region of the second dopant type formed in the substrate region.

8. The apparatus of claim 6 wherein in an off-state of the semiconductor device a junction between the first and the second doped regions is forward biased, a junction between the third and the fourth doped regions is forward biased, and a junction between the second and the third doped regions is reverse biased.

9. The apparatus of claim 6 wherein in the on state of the semiconductor device a junction between the second and the third doped regions is forward biased.

10. The apparatus of claim 1 wherein the bulk semiconductor device comprises doped regions formed in a CMOS semiconductor device, further comprising first, second, third and fourth doped regions, and wherein the first doped regions comprises a doped region of a first dopant type formed in a well of a second dopant type, and wherein the second region comprises the well, and wherein the third region comprises a substrate region of a first dopant type, and wherein the fourth doped region comprises a doped region of a first dopant type formed in the substrate region.

11. The apparatus of claim 1 wherein the element for switching on the bulk semiconductor device comprises a first and a second MOSFET.

12. The apparatus of claim 11 wherein a pn junction of the bulk semiconductor device is reverse-biased when the bulk semiconductor device is in an off state, and wherein the first and the second MOSFETS are controllable to forward bias the pn junction to switch the bulk semiconductor device to the on state.

13. The apparatus of claim 12 wherein the first and the second MOSFETS each comprises a gate terminal, a first source/drain terminal responsive to a trigger voltage and a second source/drain terminal connected to a doped region of the pn junction, and wherein the first and the second MOSFETS turn on in response to a signal applied to the gate terminal forward biasing the pn junction in response to application of the trigger voltage to the doped region of the pn junction.

14. An apparatus for opening an integrated circuit fuse by controllably passing current therethrough, comprising:
   a controllable bulk semiconductor device;
   an element for controlling an on state of the bulk semiconductor device, wherein the element for controlling the on state of the semiconductor bulk device comprises a first and a second MOSFET; and
   wherein current flows through the fuse in response to the on state of the bulk semiconductor device for opening the fuse.

15. The apparatus of claim 14 wherein a pn junction of the bulk semiconductor device is reverse-biased when the bulk semiconductor device is in an off state, and wherein the first and the second MOSFETs are controllable to forward bias the pn junction to switch the bulk semiconductor device to the on state.

16. The apparatus of claim 15 wherein the first MOSFET comprises a gate terminal, a first source/drain terminal responsive to a trigger voltage and a second source/drain terminal connected to a first doped region of the pn junction, and wherein the second MOSFET comprises a gate terminal, a first source/drain terminal connected to ground and a second source/drain terminal connected to a second doped region of the pn junction, and wherein the first and the second MOSFETs turn on in response to a signal applied to the gate terminal of the first and the second MOSFETs forward biasing the pn junction in response to application of the trigger voltage to the first doped region of the pn junction while the second doped region of the pn junction is connected to ground.

17. An apparatus for selectively controlling current flow through an integrated circuit fuse, comprising:

a thyristor controllably responsive to the current flow, wherein the thyristor comprises a plurality of alternating p-type and n-type doped regions;
a fuse serially connected to the thyristor; and
an element for switching the thyristor to an on state by controlling a voltage applied across two adjacent doped regions of the plurality of doped regions to forward bias a pn junction formed by the two adjacent doped regions, wherein while in the on state the thyristor is responsive to the current flow such that current flows through the fuse, and wherein the fuse opens in response to the current.

18. The apparatus of claim 17 wherein the thyristor comprises a first and a second doped region of opposite doping type forming a first semiconductor junction therebetween, and further comprises a third and a fourth doped region of opposite doping type forming a second semiconductor junction therebetween, and wherein the second and the third doped regions form a third semiconductor junction therebetween, and wherein the thyristor is in an on state when the first, the second and the third semiconductor junctions are forward biased, and wherein the thyristor is in an off state when the third semiconductor junction is reverse biased.

19. The apparatus of claim 18 further comprising a bias voltage, wherein the first and the third semiconductor junctions are forward biased by the bias voltage.

20. The apparatus of claim 18 wherein the element for switching the thyristor to an on state forward biases the third semiconductor junction.

21. The apparatus of claim 18 wherein the element for switching the thyristor to the on state comprises a first and a second MOSFET.

22. The apparatus of claim 21 wherein the first and the second MOSFETS are controllable to forward bias the third semiconductor junction to switch the thyristor to the on state.

23. The apparatus of claim 22 wherein each one of the first and the second MOSFETS comprises a gate terminal, a first source/drain terminal and a second source/drain terminal connected to one of the second and the third doped regions, and wherein the first and the second MOSFETS turn on in response to a signal applied to each gate terminal forward biasing the third semiconductor junction in response to a trigger voltage applied to the first source/drain terminal of the first MOSFET.

24. An apparatus for selectively controlling current flow through an integrated circuit fuse, comprising:
a thyristor controllably responsive to the current flow;
a fuse serially connected to the thyristor; and
an element for switching the thyristor to an on state, wherein the element for controlling the on state of the thyristor comprises a first and a second MOSFET, and wherein while in the on state the thyristor is responsive to the current flow such that current flows through the fuse, and wherein the fuse opens in response to the current.

25. The apparatus of claim 24 wherein the first MOSFET comprises a gate terminal, a first source/drain terminal responsive to a trigger voltage and a second source/drain terminal connected to the second doped region, and wherein the second MOSFET comprises a gate terminal, a first source/drain terminal connected to ground and a second source/drain terminal connected to the third doped region, and wherein the first and the second MOSFETs turn on in response to a signal applied to the gate terminal of the first and the second MOSFETs forward biasing the third semiconductor junction in response to application of the trigger voltage to the second doped region while the third doped region is connected to ground.

26. The apparatus of claim 24 wherein the thyristor comprises a first, a second and a third doped region formed in a semiconductor substrate, and wherein the semiconductor substrate comprises a fourth doped region of the thyristor.

27. The apparatus of claim 26 wherein the first doped region comprises a doped region of a first dopant type formed in a well of a second dopant type, and wherein the second region comprises the well of the second dopant type, and wherein the third region comprises a substrate region of a first dopant type, and wherein the fourth doped region comprises a doped region of the second dopant type formed in the substrate region.

28. The apparatus of claim 27 wherein the first, the second, the third and the fourth doped regions are formed in a CMOS semiconductor device.

29. A memory array comprising
a plurality of addressable rows;
a plurality of addressable columns;
a memory cell at an intersection of each row and column;
wherein each memory cell further comprises;
an integrated circuit fuse;
an apparatus for opening the integrated circuit fuse, further comprising:
a current source;
a controllable bulk semiconductor device comprising a plurality of doped regions;
a gating device; and
wherein current flows into the fuse in response to an on state of the bulk semiconductor device for opening the fuse, wherein the gating device controls the bulk semiconductor device to the on state by controlling a voltage applied to two adjacent doped regions of a plurality of doped regions, and wherein the voltage biases a pn junction formed by the two adjacent doped regions.

30. A method for opening an integrated circuit fuse by controllably passing current through a bulk semiconductor device connected in series with the fuse, wherein the bulk semiconductor device comprises a plurality of semiconductor pn junctions, the method comprising:
forward biasing a pn junction of the plurality of semiconductor pn junctions by applying an external voltage across the pn junction to allow current to flow through the bulk semiconductor device to the fuse for opening the fuse; and
reverse biasing at least one of the plurality of semiconductor pn junctions to prevent current flow through the bulk semiconductor device for retaining the fuse in a closed state.

31. The method of claim 30 wherein the step of forward biasing further comprises:
switching a first and a second MOSFET to an on state, wherein the first and the second MOSFETS are connected to a doped region of the reverse biased semiconductor pn junction; and
applying a forward bias voltage to the doped region through the first and the second MOSFETS.

32. The method of claim 30 wherein the bulk semiconductor device comprises a thyristor.

* * * * *